(12) United States Patent
Khurana et al.

(10) Patent No.: US 9,229,328 B2
(45) Date of Patent: Jan. 5, 2016

(54) METHODS OF FORMING SEMICONDUCTOR DEVICE STRUCTURES, AND RELATED SEMICONDUCTOR DEVICE STRUCTURES

(71) Applicant: Micron Technology, Inc., Boise, ID (US)

(72) Inventors: Ranjan Khurana, Boise, ID (US); Gurpreet S. Lugani, Boise, ID (US); Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 13/875,918

(22) Filed: May 2, 2013

(65) Prior Publication Data

US 2014/0329179 A1   Nov. 6, 2014

(51) Int. Cl.
   *G03F 7/40* (2006.01)

(52) U.S. Cl.
   CPC ........................................ *G03F 7/40* (2013.01)

(58) Field of Classification Search
   CPC ........................................................ G03F 7/40
   USPC ........................................ 430/311, 313, 325
   See application file for complete search history.

(56) References Cited

U.S. PATENT DOCUMENTS

| | | |
|---|---|---|
| 4,623,674 A | 11/1986 | Bailey |
| 4,797,357 A | 1/1989 | Mura et al. |
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |

(Continued)

FOREIGN PATENT DOCUMENTS

| CN | 1562730 A | 1/2005 |
|---|---|---|
| CN | 1799131 A | 7/2006 |

(Continued)

OTHER PUBLICATIONS

Electronegativity—<http://www.princeton.edu/~achaney/tmve/wiki100k/docs/Electronegativity.html> website, visited Aug. 28, 2013, 1 page.

(Continued)

*Primary Examiner* — Kathleen Duda
(74) *Attorney, Agent, or Firm* — TraskBritt

(57) ABSTRACT

A method of forming a semiconductor device structure comprises forming a template material over a substrate, the template material exhibiting preferential wetting to a polymer block of a block copolymer. A positive tone photoresist material is formed over the template material. The positive tone photoresist material is exposed to radiation to form photoexposed regions and non-photoexposed regions of the positive tone photoresist material. The non-photoexposed regions of the positive tone photoresist material are removed with a negative tone developer to form a pattern of photoresist features. The pattern of photoresist features and unprotected portions of the template material are exposed to an oxidizing plasma to form trimmed photoresist features and a pattern of template features. The trimmed photoresist features are removed with a positive tone developer. Other methods of forming a semiconductor device structure, and a semiconductor device structure are also described.

19 Claims, 3 Drawing Sheets

(56) References Cited

U.S. PATENT DOCUMENTS

| | | |
|---|---|---|
| 5,538,655 A | 7/1996 | Fauteux et al. |
| 5,580,700 A | 12/1996 | Rahman et al. |
| 5,620,850 A | 4/1997 | Bamdad et al. |
| 5,622,668 A | 4/1997 | Thomas et al. |
| 5,772,905 A | 6/1998 | Chou |
| 5,834,583 A | 11/1998 | Hancock et al. |
| 5,849,810 A | 12/1998 | Müeller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh et al. |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,306 B2 | 2/2012 | Cheng et al. |
| 8,206,601 B2 | 6/2012 | Bosworth et al. |
| 8,287,749 B2 | 10/2012 | Hasegawa et al. |
| 8,294,139 B2 | 10/2012 | Marsh et al. |
| 8,409,449 B2 | 4/2013 | Millward et al. |
| 8,445,592 B2 | 5/2013 | Millward |

(56) References Cited

U.S. PATENT DOCUMENTS

| | | |
|---|---|---|
| 8,808,557 B1 | 8/2014 | Seino et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0196748 A1 | 10/2003 | Hougham et al. |
| 2003/0218644 A1 | 11/2003 | Higuchi et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0109263 A1* | 6/2004 | Suda et al. ................... 360/322 |
| 2004/0124092 A1 | 7/2004 | Black |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078982 A1 | 4/2008 | Min et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |

(56) References Cited

U.S. PATENT DOCUMENTS

| | | |
|---|---|---|
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0087664 A1 | 4/2009 | Nealey et al. |
| 2009/0155579 A1 | 6/2009 | Greco et al. |
| 2009/0196488 A1 | 8/2009 | Nealey et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0028471 A1* | 2/2012 | Oyama et al. ............ 438/694 |
| 2012/0122292 A1 | 5/2012 | Sandhu et al. |
| 2012/0133017 A1 | 5/2012 | Millward et al. |
| 2012/0135146 A1 | 5/2012 | Cheng et al. |
| 2012/0135159 A1 | 5/2012 | Xiao et al. |
| 2012/0138570 A1 | 6/2012 | Millward et al. |
| 2012/0164389 A1 | 6/2012 | Yang et al. |
| 2012/0202017 A1* | 8/2012 | Nealey et al. ............ 428/195.1 |
| 2012/0211871 A1 | 8/2012 | Russell et al. |
| 2012/0223053 A1 | 9/2012 | Millward et al. |
| 2012/0225243 A1 | 9/2012 | Millward |
| 2013/0295323 A1 | 11/2013 | Millward |
| 2013/0330668 A1* | 12/2013 | Wu et al. ............ 430/270.1 |
| 2014/0060736 A1 | 3/2014 | Millward et al. |
| 2014/0127626 A1 | 5/2014 | Senzaki et al. |
| 2014/0272723 A1 | 9/2014 | Somervell et al. |
| 2015/0021293 A1 | 1/2015 | Morris et al. |

FOREIGN PATENT DOCUMENTS

| | | | |
|---|---|---|---|
| CN | 101013662 A | | 8/2007 |
| EP | 0784543 B1 | | 4/2000 |
| EP | 1416303 A2 | | 5/2004 |
| EP | 1906237 A2 | | 4/2008 |
| EP | 1593164 B1 | | 6/2010 |
| JP | 11080414 A | | 3/1999 |
| JP | 2003155365 | | 5/2003 |
| JP | 2004335962 | | 11/2004 |
| JP | 2005008882 A | | 1/2005 |
| JP | 2005029779 A | | 2/2005 |
| JP | 2006036923 A | | 2/2006 |
| JP | 2006055982 A | | 3/2006 |
| JP | 2006110434 A | | 4/2006 |
| JP | 2007194175 A | | 8/2007 |
| JP | 2008036491 | | 2/2008 |
| JP | 2008036491 A | | 2/2008 |
| KR | 1020060128378 A | | 12/2006 |
| KR | 20070029762 | | 3/2007 |
| KR | 100771886 B1 | | 11/2007 |
| TW | 200400990 | | 3/1992 |
| TW | 200633925 | | 10/1994 |
| TW | 584670 B | | 4/2004 |
| TW | 200419017 | | 10/2004 |
| TW | 200511364 | | 3/2005 |
| TW | 256110 | | 6/2006 |
| TW | I253456 | | 11/2007 |
| TW | 200740602 | | 1/2008 |
| TW | 200802421 | | 1/2008 |
| WO | 90007575 | | 7/1990 |
| WO | 9706013 A1 | | 2/1997 |
| WO | 9839645 A1 | | 9/1998 |
| WO | 9947570 A1 | | 9/1999 |
| WO | 0031183 | | 6/2000 |
| WO | 0218080 A1 | | 3/2002 |
| WO | 0281372 A2 | | 10/2002 |
| WO | 03045840 A2 | | 6/2003 |
| WO | 2005122285 A2 | | 12/2005 |
| WO | 2006003592 A2 | | 1/2006 |
| WO | 2006003594 A2 | | 1/2006 |
| WO | 2006076016 A2 | | 7/2006 |
| WO | 2006078952 A1 | | 7/2006 |
| WO | 2006112887 A2 | | 10/2006 |
| WO | 2007001294 A1 | | 1/2007 |
| WO | 2007013889 A2 | | 2/2007 |
| WO | 2007024241 A2 | | 3/2007 |
| WO | 2007024323 A2 | | 3/2007 |
| WO | 2007019439 A3 | | 5/2007 |
| WO | 2007055041 A1 | | 5/2007 |
| WO | 2008055137 A2 | | 5/2008 |
| WO | 2008091741 A2 | | 7/2008 |
| WO | 2008096335 A2 | | 8/2008 |
| WO | 2008097736 A2 | | 8/2008 |
| WO | 2008118635 A2 | | 10/2008 |
| WO | 2008124219 A2 | | 10/2008 |
| WO | 2008130847 A1 | | 10/2008 |
| WO | 2008145268 A1 | | 12/2008 |
| WO | 2008156977 A2 | | 12/2008 |
| WO | 2009099924 A2 | | 8/2009 |
| WO | 2009102551 A2 | | 8/2009 |
| WO | 2009117238 A2 | | 9/2009 |
| WO | 2009117243 A1 | | 9/2009 |
| WO | 2009134635 A2 | | 11/2009 |

OTHER PUBLICATIONS

Ali, H. A., et al., Properties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.

Bae, Joonwon, "Surface Modification Using Photo-Crosslinkable Random Copolymers", Abstract submitted for the Mar. 2006 meeting of The American Physical Society, submitted Nov. 30, 2005. (Accessed via the Internet [retrieved on Apr. 5, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm.

Bang, J., "The Effect of Humidity on the Ordering of Tri-block Copolymer Thin Films," Abstract submitted for the Mar. 2007 meeting of The American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, (published online Mar. 23, 2003).

Berry, B. C., et al., "Orientational Order in Block Copolymer Films Zone Annealed Below the Order—Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Berry, B. C., et al., "Effects of Zone Annealing on Thin Films of Block Copolymers", National Institute of Standard and Technology, Polymers Division, Maryland, USA, 2007, 2 pages.

Black et al., Integration of Self-Assembled Diblock Copolymers for Semiconductor Capacitor Fabrication, Applied Physics Letters, vol. 79, No. 3, pp. 409-411 (2001).

(56) References Cited

OTHER PUBLICATIONS

Black et al., Polymer Self Assembly in Semiconductor Microelectronics, IBM J. Res. & Dev. vol. 51, No. 5, Sep. 2007, pp. 605-633.
Black, C. T., et al., "Integration of Self Assembly for Semiconductor Microelectronics," IEEE 2005 Custom Integrated Circuits Conference, IBM T.J. Watson Research Center, pp. 87-91.
Black, C. T., "Self-aligned self-assembly of multi-nanowire silicon field effect transistors," Appl. Phys. Lett, vol. 87, pp. 163116-1 through 163116-3, 2005.
Black, C. T., "Polymer Self-Assembly as a Novel Extension to Optical Lithography," ACSNano, vol. 1, No. 3, 2007, American Chemical Society, pp. 147-150.
Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.
Black, C. T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.
Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).
Black, C. T., et al., Polymer Self Assembly in Semiconductor Microelectronics, IBM J. Res. & Dev. vol. 51, No. 5, Sep. 2007, pp. 605-633.
Botelho Do Rego, A. M, et al., "Diblock Copolymer Ultrathin Films Studied by High Resolution Electron Energy Loss Spectroscopy," Surface Science, 482-485 (2001), pp. 1228-1234.
Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Published online Aug. 13, 1999, Abstract only.
Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Candau, F., et al., "Synthesis and Characterization of Polystyrene-poly(ethylene oxide) Graft Copolymers," Polymer, 1977, vol. 18, pp. 1253-1257.
Cavicchi, K. A., et al., "Solvent Annealed Thin Films of Asymmetric Polyisoprene—Polylactide Diblock Copolymers," Macromolecules 2007, vol. 40, 2007, Univ. of Massachusetts, pp. 1181-1186.
Cha, J. N., et al., Biomimetic Approaches for Fabricating High-Density Nanopatterned Arrays, Chem. Mater. vol. 19, 2007, pp. 839-843.
Chai et al., Assembly of Aligned Linear Metallic Patterns on Silicon, Nature Nanotechnology, vol. 2, Aug. 2007, pp. 500-506.
Chai et al., Using Cylindrical Domains of Block Copolymers to Self-Assemble and Align Metallic Nanowires, American Chemical Society, www.Acsnano.org, 2008. pp. A-K.
Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Chang, Li-Wen, "Diblock Copolymer Directed Self-Assembly for CMOS Device Fabrication," Proc. of SPIE, vol. 6156, 2006, 615611-1 to 615611-6.
Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.

Chen et al., Highly Ordered Arrays of Mesoporous Silica Nanorods with Tunable Aspect Ratios from Block Copolymer Thin Films, Advanced Materials, vol. 20, pp. 763-767, 2008.
Cheng, J. Y., et al., "Rapid Directed Self Assembly of Lamellar Microdomains from a Block Copolymer Containing Hybrid," Applied Physics Letters, 91, 143106-143106-3 (2007).
Cheng, J. Y., et al., "Self-Assembled One-Dimensional Nanostructure Arrays," Nano Letters, vol. 6, No. 9, 2006, pp. 2099-2103.
Cheng, J.Y., et al., "Templated Self-Assembly of Block Copolymers: Effect of Substrate Topography," Adv. Mater. 2003, vol. 15, No. 19, pp. 1599-1602.
Cho et al., Nanoporous Block Copolymer Micelle/Micelle Multilayer Films with Dual Optical Properties, J. Am. Chem. Soc., vol. 128, No. 30, pp. 9935-9942 (2006).
Choi, H. J., et al., "Magnetorheology of Synthesized Core—Shell Structured Nanoparticle," IEEE Transactions on Magnetics, vol. 41, No. 10, Oct. 2005, pp. 3448-3450.
Clark et al., "Selective Deposition in Multilayer Assembly: SAMs as Molecular Templates," Supramolecular Science, vol. 4, pp. 141-146, (1997).
Daoulas Kostas CH., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-036104-3.
Darling, S. B., "Directing the Self-assembly of Block Copolymers," Progress in Polymer Science, vol. 32, No. 10, Sep. 28, 2007, pp. 1152-1204.
Desai, Dr. Trejal A., et al., "Engineered Silicon Surfaces for Biomimetic Interfaces," Business Briefing: Medical Device Manufacturing & Technology, 2002.
Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.
Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.
Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.
Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.
Fasolka et al., Block Copolymer Thin Films: Physics and Applications, Annual Review, vol. 31, pp. 323-355 (2001).
Fasolka, M. J. et al., "Morphology of Ultrathin Supported Diblock Copolymer Films: Theory and Experiment," Macromolecules 2000, vol. 33, No. 15, pp. 5702-5712.
Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.
Gates, "Nanofabrication with Molds and Stamps," Materials Today, pp. 44-49, (Feb. 2005).
Gates, B. D., et al., "Unconventional Nanofabrication," Annu. Rev. Mater. Res. 2004, 34:339-72.
Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.
Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.
La, Young-Hye, et al., "Directed Assembly of Cylinder-Forming Block Copolymers into Patterned Structures to Fabricate Arrays of Spherical Domains and Nanoparticles," Chem. Mater, 2007, vol. 19,

(56) References Cited

OTHER PUBLICATIONS

No. 18, Department of Chemical and Biological Engineering and Center for Nanotechnology, Univ. of Wisconsin, pp. 4538-4544.
La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.
Laracuente, A.R., et al., "Step Structure and Surface Morphology of Hydrogen-terminated Silicon: (001) to (114)," Surface Science 545, 2003, pp. 70-84.
Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.
Li, Mingqi, et al., "Block Copolymer Patterns and Templates," Materials Today, vol. 9, No. 9, Sep. 2006, pp. 30-39.
Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.
Li, Xue, et al., "Morphology Change of Asymmetric Diblock Copolymer Micellar Films During Solvent Annealing," ScienceDirect, Polymer 48 (2007), pp. 2434-2443.
Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.
Lin, Zhiqun, et al., "A Rapid Route to Arrays of Nanostructures in Thin Films," Adv. Mater. 2002, 14 No. 19, Oct. 2, pp. 1373-1376.
Lin-Gibson, Sheng, et al., "Structure—Property Relationships of Photopolymerizable Poly(ethylene glycol) Dimethacrylate Hydrogels," Macromolecules 2005, 38, American Chemical Society, pp. 2897-2902.
Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.
Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.
Lopes et al., Hierarchical Self-Assembly of Metal Nanostructures on Diblock Copolymer Scaffolds, Nature, vol. 414, Dec. 13, 2001, pp. 735-738.
Lutolf, M., et al., "Cell-Responsive Synthetic Hydrogels," Adv. Mater., vol. 15, No. 11, Jun. 2003, pp. 888-892.
Lutolf, M.P., et al, "Synthetic Biomaterials as Instructive Extracellular Microenvironments for Morphogenesis in Tissue Engineering," Nature Biotechnology, 23, 47-55 (2005), Abstract only.
Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.
Malenfant et al., Self-Assembly of an Organic-Inorganic Block Copolymer for Nano-Ordered Ceramics, Nature Nanotechnology, vol. 2, pp. 43-46 (2007).
Malkoch, M., et al., "Synthesis of Well-defined Hydrogel Networks Using Click Chemistry," Chem. Commun., 2006, The Royal Society of Chemistry, pp. 2774-2776.
Mansky, P., et al., "Controlling Polymer-Surface Interactions with Random Copolymer Brushes," Science, vol. 275, Mar. 7, 1997, pp. 1458-1460.
Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.
Matsuda, T., et al., "Photoinduced Prevention of Tissue Adhesion," ASAIO J, Jul.-Sep. 1992; 38(3): M154-7, Abstract only.
Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.
Metters, A., et al., "Network Formation and Degradation Behavior of Hydrogels Formed by Michael-Type Addition Reactions," Biomacromolecules 2005, 6, 2005, pp. 290-301.
Meyer, E., et al., "Controlled Dewetting Processes on Microstructured Surfaces—a New Procedure for Thin Film Microstructuring," Macromollecular Mater. Eng., 276/277, 2000, Institute of Polymer Research Dresden, pp. 44-50.
Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.
Mindel, J., et.al., "A Study of Bredig Platinum Sols", The Chemical Laboratories of New York University, received Jun. 10, 1943, vol. 65 pp. 2112.
Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.
Nealey, P. F., et al., "Self-Assembling Resists for Nanolithography", IProceedings of the IEEE International Electron Devices Meeting, IEDM Technical Digest, 356-359 (2005).
Nguyen, K. T., et al., "Photopolymerizable Hydrogels for Tissue Engineering Applications," Biomaterials 23, 2002, pp. 4307-4314.
Nishikubo, T., "Chemical Modification of Polymers via a Phase-Transfer Catalyst or Organic Strong Base," American Chemical Society Symposium Series, 1997, American Chemical Society, pp. 214-230.
Niu, Sanjun, et al., "Stability of Order in Solvent-Annealed Block Copolymer Thin Films," Macromolecules, vol. 36, No. 7, 2003, Univ. of Nebraska, USA, pp. 2428-2440.
Niu, Sanjun, et al., "Selective assembly of nanoparticles on block copolymer by surface modification," Nanotechnology, vol. 18, pp. 1-4, 2007.
Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.
Parejo, P. G., et al., "Highly Efficient UV-absorbing Thin-film Coatings for Protection of Organic Materials Against Photodegradation," J. Mater. Chem., 2006, 16, The Royal Society of Chemistry, pp. 2165-2169.
Park et al., Fabrication of Highly Ordered Silicon Oxide Dots and Stripes from Block Copolymer Thin Films, Advanced Materials, vol. 20, pp. 681-685, 2008.
Park et al., High-Aspect-Ratio Cylindrical Nanopore Arrays and Their Use for Templating Titania Nanoposts, Advanced Materials, vol. 20, pp. 738-742, 2008.
Park, Cheolmin, et al., "Enabling Nanotechnology with Self Assembled Block Copolymer Patterns," Polymer 44, 2003, pp. 6725-6760.
Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing Ltd, UK, pp. 1-7.
Park, M., et al., "Block Copolymer Lithography: Periodic Arrays of 1011 Holes in 1 Square Centimeter," Science, vol. 276, No. 5317, May 30, 1997, pp. 1401-1404.
Park, Sang-Min, et al., "Directed assembly of lamellae-forming block copolymers using chemically and topographically patterned substrates," Advanced Materials, vol. 19, No. 4, pp. 607-611, Feb. 2007.
Park, Seung Hak, et al., "Block Copolymer Multiple Patterning Integrated with Conventional ArF Lithography," Soft Matter, 2010, 6, Royal Society of chemistry, pp. 120-125.
Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.
Peng, J., et al., "Development of Nanodomain and Fractal Morphologies in Solvent Annealed Block copolymer Thin Films," Macromol. Rapid Commun. 2007, 28, pp. 1422-1428.

(56) References Cited

OTHER PUBLICATIONS

Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.

Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.

Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.

Reed, M.A., et al., "Molecular random access memory cell," Appl. Phys. Lett., vol. 78, No. 23, pp. 3735-3737, Jun. 2001.

Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.

Rogers, J. A., "Slice and Dice, Peel and Stick: Emerging Methods for Nanostructure Fabrication," ACS Nano, vol. 1, No. 3, 2007, pp. 151-153.

Rozkiewicz, Dorota I., et al., "'Click' Chemistry by Microcontact Printing," Angew. Chem. Int. Ed., vol. 45, pp. 5292-5296, 2006.

Ruiz, R., et al., "Density Multiplication and Improved Lithography by Directed Block Copolymer Assembly," Science, vol. 321, Aug. 15, 2008, pp. 936-939.

Ruiz, R., et al., "Induced Orientational Order in Symmetric Diblock Copolymer Thin-Films," Advanced Materials, vol. 19, No. 4, pp. 587-591, (2007).

Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.

Sang et al., "Epitaxial self-assembly of block copolymers on lithographically defined nanopatterned substrates", Nature, vol. 24, pp. 411-414, (Jul. 2003).

Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.

Sato et al., Novel Antireflective Layer Using Polysilane for Deep Ultraviolet Lithography, J. Vac. Sci. Technol. B, vol. 17, No. 6, pp. 3398-3401 (1999).

Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.

Segalman, R. A., "Patterning with Block Copolymer Thin Films," Materials Science and Engineering R 48 (2005), Elsevier B. V., pp. 191-226.

Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.

Sharma, S. et al., "Ultrathin Poly(ethylene glycol) Films for Silicon-based Microdevices," Applied Surface Science, 206 (2003), Elsevier Science B.V., pp. 218-229.

Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Sivaniah, E., et al., "Observation of Perpendicular Orientation in Symmetric Diblock Copolymer Thin Films on Rough Substrates," Macromolecules 2003, 36, American Chemical Society, pp. 5894-5896.

Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Solak, H. H., "Nanolithography with Coherent Extreme Ultraviolet Light," Journal of Physics D: Applied Physics, 2006, IOP Publishing Ltd., UK, pp. R171-188.

Srinvivasan, C., et al., "Scanning Electron Microscopy of Nanoscale Chemical Patterns," ACS Nano, vol. 1, No. 3, pp. 191-201, 2007.

Stoykovich, M. P., et al., "Directed Assembly of Block Copolymer Blends into Nonregular Device-Oriented Structures," Science, vol. 308, Jun. 3, 2005, pp. 1442-1446.

Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.

Sundrani, D., et al., "Guiding Polymers to Perfection: Macroscopic Alignment of Nanoscale Domains," Nano Lett., vol. 4, No. 2, 2004, American Chemical Society, pp. 273-276.

Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.

Tadd et al, Spatial Distribution of Cobalt Nanoclusters in Block Copolymers, Langmuir, vol. 18, pp. 2378-2384 (2002).

Tang et al., Evolution of Block Copolymer Lithography to Highly Ordered Square Arrays, Science, vol. 322, No. 5900, Sep. 25, 2008, pp. 429-432.

Trimbach et al., "Block Copolymer Thermoplastic Elastomers for Microcontact Printing," Langmuir, 2003, vol. 19, p. 10957.

Truskett, V. M., et. al., "Trends in Imprint Lithography for Biological Applications," TRENDS in Biotechnology, vol. 24, No. 7, Jul. 2006, pp. 312-315.

Tseng et al., Enhanced Block Copolymer Lithography Using Sequential Infiltration Synthesis, The Journal of Physical Chemistry, vol. 115, No. 36, Sep. 15, 2011, 15 pages.

Van Poll, M. L., et al., "a Self-Assembly Approach to Chemical Micropatterning of Poly(dimethylsiloxane)," Angew. Chem. Int. Ed. 2007, 46, pp. 6634-6637.

Wang, C., et al., "One Step Fabrication and characterization of Platinum Nanopore Electrode Ensembles formed via Amphiphilic Block Copolymer Self-assembly," Electrochimica Acta 52 (2006), pp. 704-709.

Wathier, M., et al., "Dendritic Macromers as in Situ Polymerizing Biomaterials for Securing Cataract Incisions," J. Am. Chem. Soc., 2004, 126 (40), pp. 12744-12745, Abstract only.

Winesett, D.A., et al., "Tuning Substrate Surface Energies for Blends of Polystyrene and Poly(methyl methacrylate)," Langmuir 2003, 19, American Chemical Society, pp. 8526-8535.

WIPF, "Handbook of Reagents for Organic Synthesis", 2005, John Wiley & Sons Ltd., p. 320.

Wu, C.Y., et al., "Self-Assembled Two-Dimensional Block Copolymers on Pre-patterned Templates with Laser Interference Lithography," IEEE, 2007, pp. 153-154.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

Xu et al., Electric Field Alignment of Symmetric Diblock Copolymer Thin Films, Department of Polymer Science and Engineering, University of Massachusetts, 5 pages (2003).

Xu et al., Interfacial Interaction Dependence of Microdomain Orientation in Diblock Copolymer Thin Films, Macromolecules, vol. 38, pp. 2802-2805 (2005).

Xu, F.J., et al., "Surface-Initiated Atom Transfer Radical Polymerization from Halogen-Terminated Si(111)(Si-X, X=Cl, Br) Surfaces for the Preparation of Well-Defined Polymer-Si Hybrids," Langmuir, vol. 21, No. 8, pp. 3221-3225, 2005.

(56) References Cited

OTHER PUBLICATIONS

Xu, Ting, et al., "The Influence of Molecular Weight on Nanoporous Polymer Films," Polymer 42, Elsevier Science Ltd., (2001) pp. 9091-9095.
Yamaguchi, T., et al., "Resist-Pattern Guided Self-Assembly of Symmetric Diblock Copolymer," Journal of Photopolymer Science and Technology, vol. 19, No. 3, pp. 385-388 (2006).
Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.
Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.
Yang et al., Covalently Attached Graft Polymer Monolayer on Organic Polymeric Substrate via Confined Surface Inhibition Reaction, Journal of Polymer Science—A—Polymer Chemistry Edition, Sep. 28, 2006, pp. 745-755, vol. 45, Issue 5.
Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.
Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.
Yu et al., Contact Printing Beyond Surface Roughness: Liquid Supramolecular Nanostamping, Advanced Materials, vol. 19, 2007, pp. 4338-4342.
Yurt, Serkan, et al., "Scission of Diblock Copolymers into Their Constituent Blocks," Macromolecules 2006, vol. 39, No. 5, 2006, American Chemical Society, pp. 1670-1672.
Zaumseil et al., "Three-Dimensional and Multilayer Nanostructures Formed by Nanotransfer Printing," Nano Letters, 2003, vol. 3, No. 9, pp. 1223-1227.
Zehner, R. W., et al., "Selective Decoration of a Phase-Separated Diblock Copolymer with Thiol-Passivated Gold Nanocrystals," Langmuir, vol. 14, No. 2, pp. 241-244, Jan. 20, 1998.
Zhang et al., "Self-Assembled Monolayers of Terminal Alkynes on Gold," J. Am. Chem. Soc., vol. 129, No. 16, pp. 4876-4877, 2007.
Zhang, Mingfu, et al., "Highly Ordered Nanoporous Thin Films from Cleavable Polystyrene-block-poly(ethylene oxide),"Adv. Mater. 2007, 19, pp. 1571-1576.
GE, Zhenbin, et al., "Thermal Conductance of Hydrophilic and Hydrophobic Interfaces," PRL 96, 186101-1-186101-4, The American Physical Society, week ending May 12, 2006.
Gelest Inc., "Silane Coupling Agents: Connecting Across Boundaries," v2.0, 2006, pp. 1-56.
Genua, A., et al., "Functional Patterns Obtained by Nanoimprinting Lithography and Subsequent Growth of Polymer Brushes," Nanotechnology, 18, (2007), IOP Publishing Ltd., pp. 1-7.
Gillmor, S. D., et al., "Hydrophilic/Hydrophobic Patterned Surfaces as Templates for DNA Arrays," Langmuir 2000, vol. 16, No. 18, 2000, pp. 7223-7228.
Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. 2001.
Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.
Guo, Kai, et al., Abstract of "Synthesis and Characterization of Novel Biodegradable Unsaturated Poly(ester amide)/ Poly(ethylene glycol) Diacrylate Hydrogels", Journal of Polymer Science Part A: Polymer Chemistry, vol. 43, Issue 17, 2005 Wiley Periodicals, Inc., pp. 3932-3944.
Hadziioannou, Semiconductor Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hamley, I. W., "Introduction to Block Copolymers", Developments in Block Copolymers Science and Technology, John Wiley & Sons, Ltd., 2004, pp. 1-29.
Hammond, M. R., et al., "Temperature Dependence of Order, Disorder, and Defects in Laterally Confined Diblock Copolymer Cylinder Monolayers," Macromolecules, vol. 338, Jul. 2005; American Chemical Society, p. 6575-6585.
Harrison, C., et al., "Layer by Layer Imaging of Diblock Copolymer Films with a Scanning Electron Microscope," Polymer, vol. 39, No. 13, 1998, pp. 2733-2744.
Hawker, C. J., et al., "Facile Synthesis of Block Copolymers for Nanolithographic Applications," Polymer Reprints, American Chemical Society (2005).
Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
He et al., "Self-Assembly of Block Copolymer Micelles in an Ionic Liquid," J. Am. Chem. Soc. 2006, 128, pp. 2745-2750.
Helmbold, A., et al., "Optical Absorption of Amorphous Hydrogenated Carbon Thin Films," Thin Solid Films 283 (1996) pp. 196-203.
Helmuth, Jo A., et al., "High-Speed Microcontact Printing," J. Am. Chem. Soc., vol. 128, No. 29, pp. 9296-9297, 2006.
Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Stretchable gold conductors on elastomeric substrates," Applied Physics Letters, vol. 82, No. 15, Apr. 14, 2003, pp. 2404-2406.
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
Hutchison, J. B, et al., "Polymerizable Living Free Radical Initiators as a Platform to Synthesize Functional Networks," Chem. Mater, vol. 17, No. 19, 2005, pp. 4789-4797.
Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.
In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.
Ji, Shengxiang, et al., "Generalization of the Use of Random Copolymers to Control the Wetting Behaviors of Block Copolymer Films," Macromolecules, 2008, 41(23): 9098-9103.
Ji, Shengxiang, et al., "Molecular Transfer Printing Using Block Copolymers," ACS Nano, vol. 4, No. 2, 2010, Dept. of Chemical and Biological Engineering, Univ. of Wisconsin, pp. 599-609.

(56) References Cited

OTHER PUBLICATIONS

Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.

Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.

Johnson, Daniel L., et al., "Probing the stability of the disulfide radical intermediate of thioredoxin using direct electrochemistry," Letters in Peptide Science, vol. 10, pp. 495-500, 2003.

Jun, Y., et al., "Microcontact Printing Directly on the Silicon Surface," Langmuir, 2002, 18(9), pp. 3415-3417, Abstract only.

Jun, Yongseok, et al., "Patterning protein molecules on poly(ethylene glycol) coated Si(111)," Biomaterials, vol. 25, pp. 3503-3509, 2004.

Karim, Alamgir, et al., "Control of Ordering Kinetics and Morphology Using Zone Annealing of Thin Block Copolymer Films", Abstract submitted for the Mar. 2007 Meeting of The American Physical Society, Nov. 20, 2006.

Kavakli et al., Single and Double-Layer Antireflection Coatings on Silicon, Turk J Phys, vol. 26, pp. 349-354 (2002).

Kim, Is, et al., "Self-assembled Hydrogel Nanoparticles Composed of Dextran and Poly (ethylene glycol) Macromer," Int J Pharm., Sep. 15, 2000; 205(1-2): 109-116, Abstract only.

Kim, Sang Ouk, et al., "Epitaxial Self-assembly of Block Copolymers on Lithographically Defined Nanopatterned Substrates," Nature, vol. 424, Jul. 24, 2003, Dept. of Chemical Engineering and Center for Nanotechnology, and Dept. of Mechanical Engineering, Univ. of Wisconsin, pp. 411-414.

Kim, Sang Ouk, et al., "Novel Complex Nanostructure from Directed Assembly of Block Copolymers on Incommensurate Surface Patterns," Adv. Mater., 2007, 19, pp. 3271-3275.

Kim, Seung Hyun, et al., "Highly Oriented and Ordered Arrays from Block Copolymers via Solvent Evaporation," Adv. Mater. 2004, 16, No. 3, Feb. 3, pp. 226-231.

Kim, Seung Hyun, et al., "Salt Complexation in Block Copolymer Thin Films," Macromolecules 2006, vol. 39, No. 24, 2006, pp. 8473-8479.

Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.

Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.

Kim, SH, et al., "Synthesis and characterization of Dextran-methacrylate Hydrogels and Structural Study by SEM," J. Biomater Res., Mar. 15, 2000; 49(4): 517-27 Abstract only.

Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, © 2008 American Vacuum Society, pp. 189-194.

Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.

Krishnamoorthy et al., Block Copolymer Micelles as Switchable Templates for Nanofabrication, Languir, vol. 22, No. 8, Mar. 17, 2006, pp. 3450-3452.

Krishnamoorthy et al., Nonopatterned Self-Assembled Monolayers by Using Diblock Copolymer Micelles as nanometer-Scale Adsorption and Etch Masks, Advanced Materials, 2008, pp. 1-4.

Krishnamoorthy, S., et al., "Nanoscale Patterning with Block Copolymers," Materials Today, vol. 9, No. 9, Sep. 2006, pp. 40-47.

Kuhnline et al., "Detecting thiols in a microchip device using micromolded carbon ink electrodes modified with cobalt phthalocyanine", Analyst, vol. 131, pp. 202-207, (2006).

Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.

Zhao et al., Colloidal Subwavelength Nanostructures for Antireflection Optical Coatings, Optics Letters, vol. 30, No. 14, pp. 1885-1887 (2005).

Zhou et al., Nanoscale Metal/Self-Assembled Monolayer/Metal Heterostructures, American Institute of Physics, pp. 611-613 (1997).

Zhu, X.Y., et al., "Molecular Assemblies on Silicon Surfaces via Si-O Linkages," Langmuir, vol. 16, 2000, American Chemical Society, pp. 6766-6772.

Zhu, X.Y., et al., "Grafting of High-Density Poly(Ethylene Glycol) Monolayers on Si(111)," Langmuir, vol. 17, pp. 7798-7803, 2001.

Li, H, W. Huck; "Ordered Block-Copolymer Assembly Using Nanoimprint Lithography". Nano. Lett. (2004), vol. 4, No. 9, p. 1633-1636.

Cheng, J., C. Ross, H. Smith, E. Thomas; "Templated Self-Assembly of Block Copolymers: Top-Down Helps Bottom-Up". Adv. Mater. (2006), 18, p. 2505-2521.

\* cited by examiner

METHODS OF FORMING SEMICONDUCTOR DEVICE STRUCTURES, AND RELATED SEMICONDUCTOR DEVICE STRUCTURES

TECHNICAL FIELD

Embodiments of the disclosure relate to the field of semiconductor device design and fabrication. More specifically, embodiments of the disclosure relate to methods of forming semiconductor device structures, and to related semiconductor device structures.

BACKGROUND

A continuing goal of integrated circuit fabrication is to decrease the dimensions thereof. Integrated circuit dimensions can be decreased by reducing the dimensions and spacing of the constituent features or structures thereof For example, by decreasing the dimensions and spacing of features (e.g., storage capacitors, access transistors, access lines) of a memory device, the overall dimensions of the memory device may be decreased while maintaining or increasing the storage capacity of the memory device.

Reducing the dimensions and spacing of semiconductor device features places ever increasing demands on the methods used to form the features. For example, due to limitations imposed by optics and radiation wavelengths, many conventional photolithographic methods cannot facilitate the formation of features having critical dimensions (e.g., widths, diameters) of less than about forty (40) nanometers (nm). Electron beam (E-beam) lithography and extreme ultraviolet (EUV) lithography have been used to form features having critical dimensions less than 40 nm, but generally require complex processes and significant costs.

One approach for achieving semiconductor device features having critical dimensions of less than about 40 nm has been patterning using chemical pattern-directed self-assembly (e.g., chemoepitaxy) of a block copolymer material, wherein a patterned template material is used to direct the self-assembly of a block copolymer material to form domains of a polymer block of a block copolymer distinct from domains of another polymer block of the block copolymer. A preferential wetting affinity of the patterned template material for one of the polymer blocks of the block copolymer directs the self-assembly of the distinct domains in accordance with the patterned template material. The domains of the polymer block or the domains of the another polymer block can be selectively removed, and the remaining domains can be utilized as desired (e.g., as an etch mask for patterning features into an underlying substrate or material). As the dimensions of the distinct domains are at least partially determined by the chain length of the block copolymer, feature dimensions much smaller than 40 nm are achievable (e.g., dimensions similar to those achievable through E-beam and EUV lithography processes).

Unfortunately, conventional methods of forming the patterned template material utilized for the chemical pattern directed self-assembly of the block copolymer material can suffer from a variety of problems. For instance, one conventional method includes foiniing a positive tone photoresist material over a template material, exposing the positive tone photoresist to radiation, removing photoexposed regions of the positive tone photoresist material with a positive tone developer to form a patterned photoresist material, removing portions of the patterned photoresist material and the template material using a plasma of oxygen ($O_2$), chlorine ($Cl_2$), and hydrogen ($H_2$), and removing remaining portions of the patterned photoresist material using a negative tone developer. Such a method can be inefficient and cost-prohibitive due to the limited number of plasma and developer chemistries suitable for use with the method. For example, negative tone developers suitable for removing the patterned photoresist material generally include hazardous materials, such as dimethyl sulphoxide (DMSO), that necessitate the use of separate, specialized, and costly equipment and processes to mitigate health, safety, and environmental concerns, and equipment longevity concerns related to the use of such hazardous materials.

A need, therefore, exists for new, simple, and cost-efficient methods of forming semiconductor device structures and patterned template materials for use in chemical pattern directed self-assembly of block copolymer materials. It would be further desirable if the methods were compatible with a wide variety of conventional tools, processes, and materials.

DETAILED DESCRIPTION

Figure 1A:
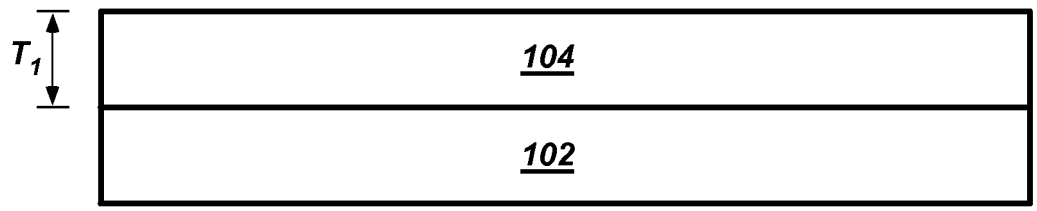
FIGS. 1A through 1F are partial cross-sectional views of a semiconductor device structure and illustrate a method of forming a semiconductor device structure including a patterned template material, in accordance with embodiments of the disclosure.

Methods of forming semiconductor device structures are disclosed, as are related semiconductor device structures. In some embodiments, a method of forming a semiconductor device structure includes forming a template material exhibiting preferential wetting to a polymer block of a block copolymer over a substrate. A photoresist material may be formed over the template material, and may be selectively exposed to radiation to form a photoexposed photoresist material including photoexposed regions and non-photoexposed regions. The non-photoexposed regions of the photoexposed photoresist material may be removed with a negative tone developer to form a patterned photoresist material including photoresist features separated by trenches. The patterned photoresist material and regions of the template material unprotected by (e.g., exposed through) the patterned photoresist material may be exposed to an oxidizing plasma to remove portions of the patterned photoresist material and the template material and form a patterned template material. Remaining portions of the patterned photoresist material may then be selectively removed using a positive tone developer. The methods disclosed herein may overcome problems associated with conventional methods of forming a patterned template material for use in chemical directed self-assembly of a block copolymer material, such as efficiency, cost, health, safety, and environmental problems related to conventional methods of forming such a patterned template material. Patterned template materials formed by the methods disclosed herein may exhibit feature dimensions equivalent to or better than feature dimensions of patterned template materials formed by conventional methods.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from the intermediate semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the singular forms "a," "an," and "the" are intended to include the plural forms as well, unless the context clearly indicates otherwise.

As used herein, relational teiris, such as "first," "second," "over," "top," "upper," "bottom," "underlying," "lower," etc., are used for clarity and convenience in understanding the disclosure and accompanying drawings and does not connote or depend on any specific preference, orientation, or order, except where the context clearly indicates otherwise.

As used herein, the term "substantially," in reference to a given parameter, property, or condition, means to a degree that one of ordinary skill in the art would understand that the given parameter, property, or condition is met with a small degree of variance, such as within acceptable manufacturing tolerances.

FIGS. 1A through 1F, are simplified partial cross-sectional views illustrating embodiments of a method of forming a semiconductor device structure including a patterned template material, such as a patterned template material for use in the chemical-directed self-assembly of a block copolymer material. With the description provided below, it will be readily apparent to one of ordinary skill in the art that the methods described herein may be used in various devices. In other words, the methods of the disclosure may be used whenever it is desired to form a patterned template material over a substrate.

Referring to FIG. 1A, a semiconductor device structure 100 may include a substrate 102, and a template material 104. The template material 104 may be formed on or over the substrate 102. As used herein, the term "substrate" means and includes a base material or other construction upon which additional materials are formed. The substrate 102 may, for example, be a semiconductor substrate, a base semiconductor material on a supporting structure, a metal electrode, a semiconductor substrate having one or more materials, features, structures or regions formed thereon, another base material, or another construction. As a non-limiting example, the substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

The template material 104 may be a material that, upon being patterned, facilitates forming a self-assembled block copolymer material. As used herein, the term "block copolymer material" means and includes a material formed of and including at least one block copolymer. In turn, as used herein, the term "block copolymer" means and includes a polymer including two or more polymer blocks bound to one or more polymer blocks of unlike (e.g., different) type. The template material 104 may, for example, be formed from a material that exhibits preferential wetting to one polymer block (e.g., a minority block, or a majority block) of a block copolymer. As used herein, the term "preferential wetting" refers to wetting of a contacting surface by a block copolymer wherein one polymer block of the block copolymer will wet the contacting surface at an interface with lower free energy than at least one other polymer block of the block copolymer. Thus, the different polymer blocks of the block copolymer may have different affinities for the contacting surface. Conversely, as used herein, the term "neutral wetting" refers to wetting of a contacting surface by a block copolymer wherein different polymer blocks of the block copolymer will wet the contacting surface at an interface with substantially the same free energy. Thus, the different polymer blocks may have equal or substantially equal affinity for the contacting surface. As a non-limiting example, the template material 104 may be formed of and include at least one material (e.g., a polystyrene-containing material) formulated to be preferential wetting to a polystyrene (PS) block of a block copolymer. In some embodiments, the template material 104 is formed of and includes a material preferential wetting toward a PS block of poly(styrene-b-methylmethacrylate) (PS-b-PMMA). In additional embodiments, the template material 104 is formulated to be preferential wetting toward a PS block of poly (styrene-block-dimethylsiloxane) (PS-b-PDMS).

The template material 104 may have any thickness $T_1$ conducive to removing (e.g., etching) desired regions of the template material 104 to form a patterned template material, as described in further detail below. By way of non-limiting example, the thickness $T_1$ of the template material 104 may be greater than or equal to about 5 nanometers (nm), such as within a range of from about 5 nm to about 15 nm, within a range of from about 8 nm to about 12 nm, or within a range of from about 8 nm to about 10 nm. In some embodiments, the thickness $T_1$ of the template material 104 is about 10 nm.

Each of the substrate 102, and the template material 104 may be formed using conventional processes including, but not limited to, physical vapor deposition ("PVD"), chemical vapor deposition ("CVD"), atomic layer deposition ("ALD"), or spin-coating. PVD includes, but is not limited to, sputtering, evaporation, or ionized PVD. Such processes are known in the art and, therefore, are not described in detail herein.

Figure 1B:
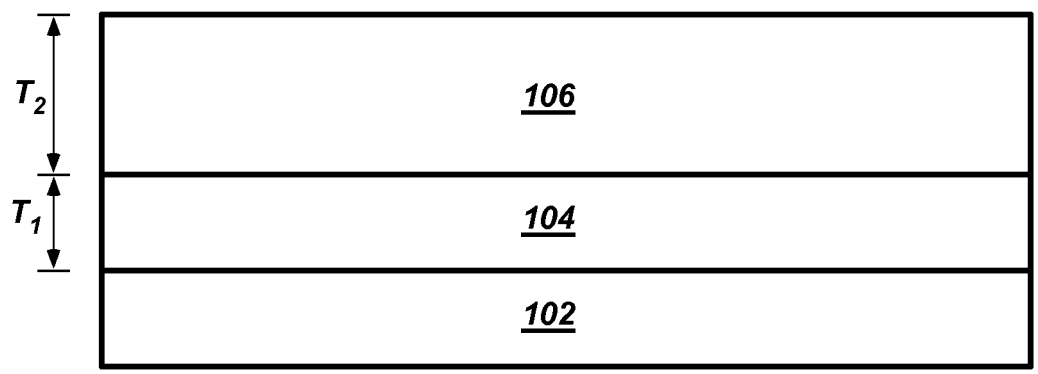

Referring to FIG. 1B, a photoresist material 106 may be formed on or over the template material 104. The photoresist material 106 may be a positive tone photoresist material, such as a positive tone photoresist material formulated to be more effectively developed by a negative tone developer than a positive tone developer. Suitable positive tone photoresist materials are known in the art, and are, therefore, not described in detail herein. For example, the photoresist material 106 may include at least one polymer including a repeating unit exhibiting at least one acid-decomposable group formulated to hydrolyze upon reaction with an acid, and at least one acid generator (e.g., a photoacid generator, a thermal acid generator). The photoresist material 106 may be formulated such that regions of the photoresist material 106 exposed to radiation (e.g., ultraviolet radiation) and a post-exposure bake become substantially soluble in a positive tone developer and substantially insoluble in a negative tone developer. As used herein, the term "positive tone developer" refers to a material, such as an aqueous alkaline solution (e.g., aqueous tetramethylammonium hydroxide (TMAH)), by which portions of the positive tone photoresist material exposed to radiation are at least partially dissolved and removed. Conversely, as used herein, the term "negative tone developer" refers to a material, such as an organic solvent (e.g., n-butyl acetate), by which portions of the positive tone photoresist material not exposed to radiation are at least partially dissolved and removed. The radiation may substantially increase the polarity of photoexposed regions of the photoresist material 106 relative to that of non-photoexposed regions of the photoresist material 106. Accordingly, the non-photoexposed regions of the photoresist material 106 may be substantially completely removed by the negative tone developer while the photoexposed regions may remain substantially intact (e.g., not removed), as described in further detail below. The formulation of photoresist material 106 may be compatible with 193 nanometer (nm) and 248 nm photolithography systems.

The photoresist material 106 may have any thickness $T_2$ conducive to forming photoresist features that may be used to form a patterned template material from the template material 104, as described in further detail below. By way of non-limiting example, the thickness $T_2$ of the photoresist material 106 may be greater than or equal to about 15 nm, such as within a range of from about 20 nm to about 150 nm, within a range of from about 50 nm to about 120 nm, or within a range of from about 70 nm to about 110 nm. In some embodiments, the thickness $T_2$ of the photoresist material 106 is about 90 nm.

The photoresist material 106 may be formed on or over the template material 104 using conventional processes (e.g., a conventional deposition process, a conventional baking process) and equipment, which are not described in detail herein.

Figure 1C:
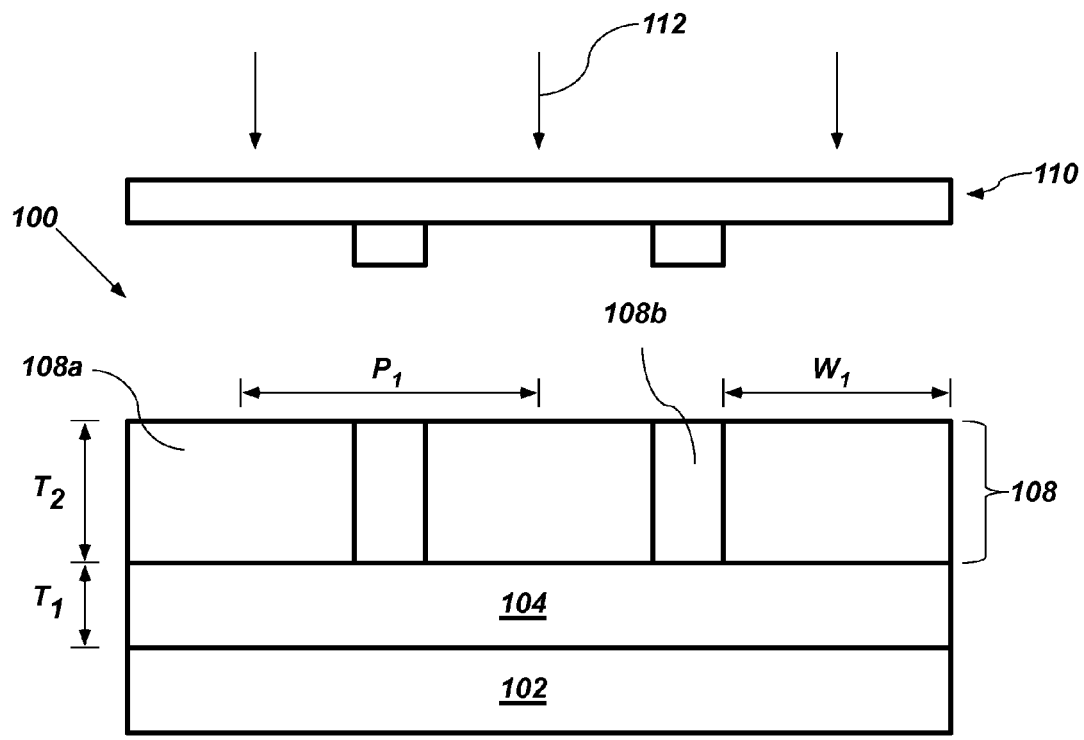

Referring to FIG. 1C, the photoresist material 106 (FIG. 1B) may be selectively exposed to radiation 112 (e.g., a wavelength of ultraviolet radiation less than or equal to 248 nm, such as a 193 nm wavelength of ultraviolet radiation) to form a photoexposed photoresist material 108 including photoexposed regions 108a and non-photoexposed regions 108b. The photoexposed regions 108a may be separated from one another by the non-photoexposed regions 108b. As shown in FIG. 1C, the photoresist material 106 (FIG. 1B) may be exposed to the ultraviolet radiation 112 through a mask 110 including a predetermined pattern to form the photoexposed regions 108a and non-photoexposed regions 108b. In additional embodiments, the photoexposed photoresist material 108 may be formed through direct writing (e.g., without a mask) of the photoresist material 106. The photoexposed regions 108a of the photoexposed photoresist material 108 may be substantially more soluble in a positive tone developer (e.g., an aqueous 2.38% TMAH solution) than the non-photoexposed regions 108b of photoexposed photoresist material 108, and the non-photoexposed regions 108b of the photoexposed photoresist material 108 may be substantially more soluble in a negative tone developer (e.g., n-butyl acetate) than the photoexposed regions 108a of the photoexposed photoresist material 108. In some embodiments, the photoexposed regions 108a of the photoexposed photoresist material 108 are substantially soluble in the positive tone developer and substantially insoluble in the negative tone developer, and the non-photoexposed regions 108b of photoexposed photoresist material 108 are substantially soluble in the negative tone developer and substantially insoluble in the positive tone developer. A conventional post-exposure bake may be utilized to enhance the solubility of the photoexposed regions 108a in the positive tone developer.

The photoexposed regions 108a and the non-photoexposed regions 108b (and, hence, the configuration of the mask 110) may be configured to exhibit any desired dimensions and spacing. The dimensions and spacing of the photoexposed regions 108a may be selected at least partially based on desired dimensions and spacing of template features to be formed using a patterned photoresist material formed from the photoexposed photoresist material 108, as described in further detail below. Each of the photoexposed regions 108a (and, hence, each of the non-photoexposed regions 108b) may be configured to exhibit substantially the same dimensions and spacing, or at least one of the photoexposed regions 108a may exhibit at least one of different dimensions and different spacing than at least one other of the photoexposed regions 108a. In some embodiments, each of the photoexposed regions 108a is configured to exhibit substantially the same dimensions and spacing. For example, the photoexposed regions 108a may each be configured to exhibit substantially the same thickness $T_2$ (e.g., that of the photoresist material 106 previously described in relation to FIG. 1B), length (not shown), and substantially the same width $W_1$. The width $W_1$ of each of the photoexposed regions 108a may, for example, be less than or equal to about 80 nm, such as within a range of from about 30 nm to about 80 nm, within a range of from about 40 nm to about 70 nm, or within a range of from about 50 nm to about 60 nm. In some embodiments, the width $W_1$ of each of the photoexposed regions 108a is about 55 nm. In addition, the photoexposed photoresist material 108 may be formed to exhibit substantially the same pitch $P_1$ between adjacent photoexposed regions 108a. As used herein, the term "pitch" refers to the distance between identical points in two adjacent (i.e., neighboring) features. The pitch $P_1$ between the adjacent photoexposed regions 108a may, for example, be characterized as the distance between centers of the adjacent photoexposed regions 108a. In some embodiments, the pitch $P_1$ between adjacent photoexposed regions 108a is about 128 nm.

Figure 1D:
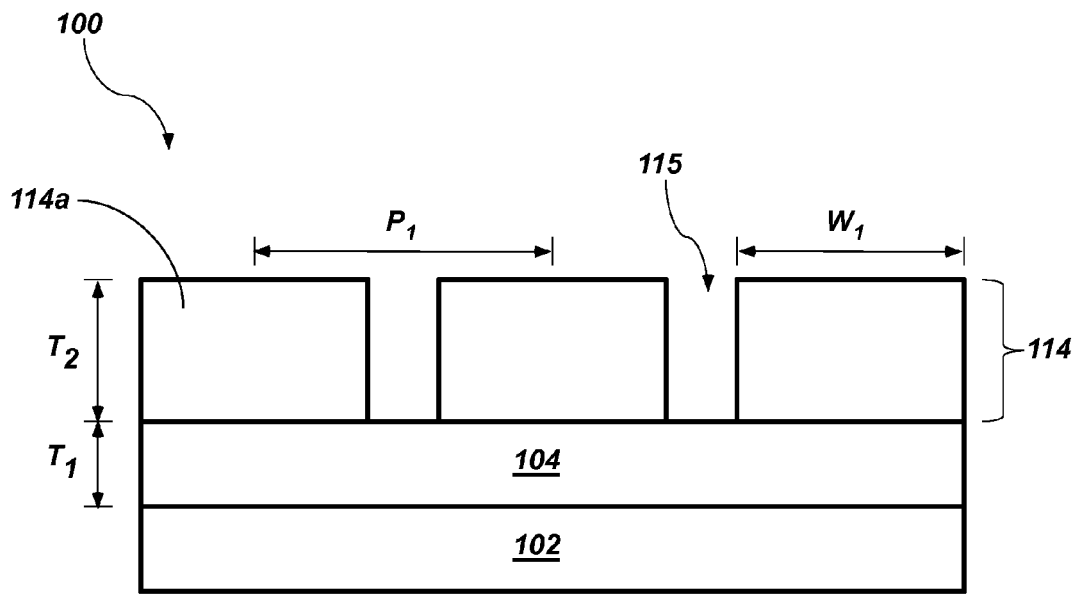

Referring next to FIG. 1D, the photoexposed photoresist material 108 (FIG. 1C) may be exposed to a negative tone developer to selectively remove the non-photoexposed regions 108b (FIG. 1C) and form a patterned photoresist material 114 including photoresist features 114a separated by trenches 115. As depicted in FIG. 1D, the trenches 115 may be defined by opposing sidewalls of adjacent photoresist features 114a, and by an exposed upper surface of the template material 104. The photoresist features 114a may correspond to the photoexposed regions 108a of the photoexposed photoresist material 108. Accordingly, the photoresist features 114a may be substantially soluble in a positive tone developer (e.g., an aqueous alkaline solution), and may exhibit substantially the same dimensions and spacing as the photoexposed regions 108a of the photoexposed photoresist material 108.

The negative tone developer used to pattern the photoresist material 106 (FIG. 1B) may be any developer formulated to substantially completely remove the non-photoexposed regions 108b of the photoexposed photoresist material 108 without substantially removing the photoexposed regions 108a of the photoexposed photoresist material 108. By way of non-limiting example, the negative tone developer may be a developer including at least one organic solvent, such as at least one of a ketone-based solvent, an ester-based solvent, an alcohol-based solvent, an amide-based solvent, an ether-based solvent, and a hydrocarbon-based solvent. Suitable ketone-based solvents include, but are not limited to, 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, actonylacetone, ionone, diacetonyl alcohol, acetyl carbinol, acetophenone, methyl naphthyl ketone, isophorone, and propylene carbonate. Suitable ester-based solvents include, but are not limited to, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, 3-methoxybutyl acetate, ethyl-3-ethoxypropionate, 3-methyl-3-methoxybutyl acetate, methyl formate, ethyl formate, butyl formate, propyl formate, ethyl lactate, butyl lactate, and propyl lactate. Suitable alcohol-based solvents include, but are not limited to, methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; a glycol-based solvent such as ethylene glycol, diethylene glycol, and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methyl butanol. Suitable amide-based solvents include, but are not limited to, hexamethylphosphoric triamide, N-methyl-2-pyrrolidone, N,N-dimethylacetamide, N,N-dimethylformamide, and 1,3-dimethyl-2-imidazolidinone. Suitable ether-based solvents include, but are not limited to, the glycol ether-based solvents previously described, dioxane, and tetrahydrofuran. Suitable hydrocarbon-based solvents include, but are not limited to, aromatic hydrocarbon-based solvents, such as toluene and xylene; and aliphatic hydrocarbon-based solvents, such as pentane, hexane, octane, and decane. The negative tone developer may be selected at least partially based on the material composition of the photoresist material 106 (FIG. 1B). In some embodiments, the negative tone developer comprises neat (e.g., undiluted) n-butyl acetate. The photoexposed photoresist material 108 may be exposed to the negative tone developer using conventional processes and equipment, which are not described in detail herein.

Removing portions of the photoexposed photoresist material 108 (FIG. 1C) using a negative tone developer (e.g., n-butyl acetate) may reduce the complexity and costs of forming a patterned template material, increase production efficiency, and mitigate health, safety, and environmental concerns as compared to conventional methods utilizing a positive tone developer (e.g., an aqueous alkaline solution). For example, as described in further detail below, using a negative tone developer to form the patterned photoresist material 114 may enable a broader range of etch chemistries to be used, and may also enable the use of relatively less toxic materials (e.g., developers) to remove photoresist features remaining following the formation of the patterned template material.

Figure 1E:
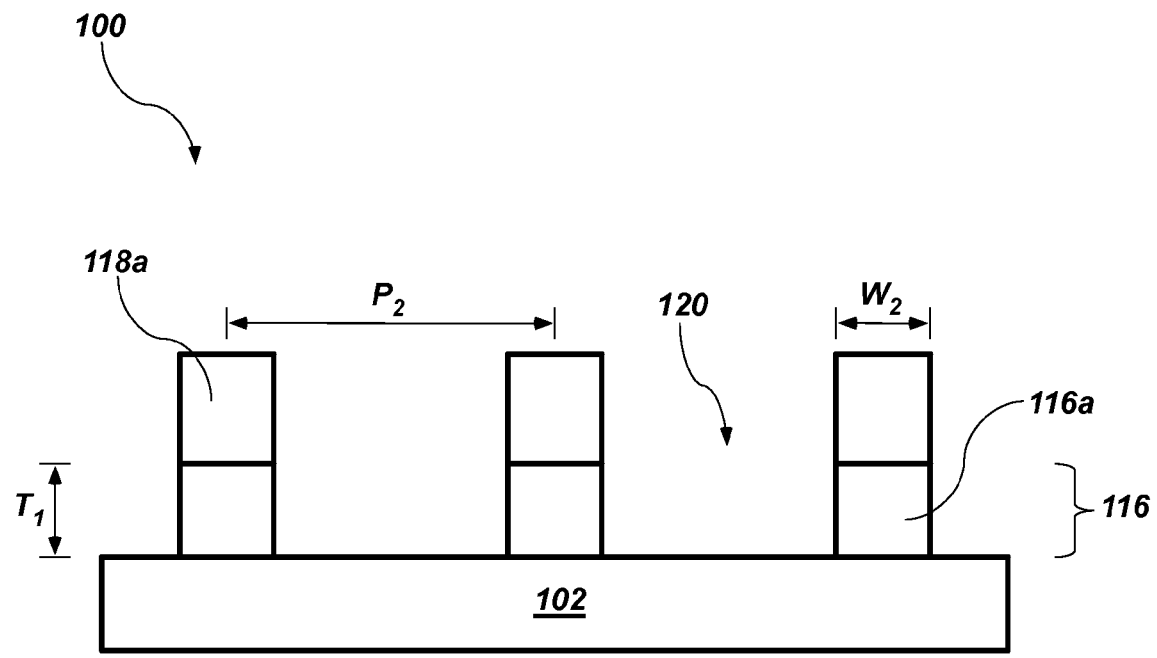

Referring next to FIG. 1E, the patterned photoresist material 114 (FIG. 1D) and unprotected (e.g., exposed) portions of the template material 104 (FIG. 1D) may be exposed to an oxidizing plasma to form a patterned template material 116 including template features 116a separated by trenches 120. The oxidizing plasma may remove (e.g., etch) portions of the photoresist features 114a to form trimmed photoresist features 118a and may simultaneously remove (e.g., etch) the unprotected portions of the template material 104 to form the template features 116a. As the oxidizing plasma reduces (e.g., trims) lateral dimensions of the photoresist features 114a, the unprotected portions of the template material 104 may increase in size, enabling additional amounts of the template material 104 to be removed. The use of the oxidizing plasma may enable relatively large portions of the patterned photoresist material 114 to be removed with underlying portions of the template material 104 to simultaneously form the trimmed photoresist features 118a and the template features 116a. By way of example, the oxidizing plasma may remove greater than or equal to about 20 nm of the patterned photoresist material 114, such as greater than or equal to about 30 nm of the patterned photoresist material 114, or greater than or equal to about 40 nm of the patterned photoresist material 114. In some embodiments, the oxidizing plasma removes about 40 nm of the patterned photoresist material 114.

The oxidizing plasma may be any oxygen-containing plasma formulated to remove exposed portions of the patterned photoresist material 114 and the template material 104 while enabling the trimmed photoresist features 118a ultimately formed to at least exhibit a solubility in a positive tone developer (e.g., an aqueous alkaline solution) substantially similar to the solubility of the photoresist features 114a (FIG. 1D) in the positive tone developer. In some embodiments, use of the oxidizing plasma may enhance the solubility of the trimmed photoresist features 118a in a positive tone developer relative to that of the photoresist features 114a. For example, the oxidizing plasma may volatilize and remove portions of the photoresist features 114a to form the trimmed photoresist features 118a (as well as volatilizing and removing unprotected portions of the template material 104 to form the template features 116a), and may also oxidize surfaces of the trimmed photoresist features 118a so that the trimmed photoresist features 118a are more soluble in a positive tone developer as compared to the photoresist features 114a. Put another way, the oxidizing plasma may increase the polarity of the trimmed photoresist features 118a relative to the photoresist features 114a. In some embodiments, the oxidizing plasma converts (e.g., oxidizes) ester groups in the photoresist material 114 to carboxylic acid groups, which increases the polarity and, thus, solubility of the trimmed photoresist features 118a in a positive tone developer (e.g., an aqueous alkaline solution). The oxidizing plasma may include, for example, at least one oxidizing agent (e.g., oxygen, sulfur dioxide, nitrogen dioxide, nitrous oxide, dinitrogen tetroxide), and at least one noble gas element (e.g., helium, neon, argon, krypton, xenon, radon). The oxidizing plasma may be substantially free of materials that would otherwise reduce the solubility of the trimmed photoresist features 118a in the positive tone developer. The oxidizing plasma may, for example, be substantially free of fluorine (F) atoms, chlorine (Cl) atoms, and bromine (Br) atoms. By way of non-limiting example, the oxidizing plasma may be substantially free of nitrogen triflouride ($NF_3$), diflouromethane ($CH_2F_2$), carbon tetraflouride ($CF_4$), sulfur hexafluoride ($SF_6$), $Cl_2$, and hydrogen bromide (HBr). In some embodiments, the oxidizing plasma is substantially free of materials other than the oxidizing agent and the noble gas element. By way of non limiting example, the oxidizing plasma may comprise a plasma of oxygen ($O_2$) and helium (He), a plasma of sulfur dioxide ($SO_2$) and He, or a plasma of $O_2$, $SO_2$, and He. In some embodiments, the oxidizing plasma is a plasma of $O_2$ and He. In additional embodiments, the oxidizing plasma is substantially free of materials other than the oxidizing agent. For example, in some embodiments, the oxidizing plasma is an $O_2$ plasma.

The relative amounts of the various components (e.g., the oxidizing agent, the noble gas element) of the oxidizing plasma may be selected based on the dimensions and material compositions of the template material 104 (FIG. 1D) and the patterned photoresist material 114 (FIG. 1D), and based on desired dimensions of the template features 116a of the patterned template material 116. For example, the relative amounts of the various components of the oxidizing plasma may be selected to enable sufficient amounts of the photoresist features 114a and the template material 104 to be simultaneously removed to impart the template features 116a with desired dimensions. The oxidizing plasma may be more selective to one of the patterned template material 116 and the template material 104 than the other of the patterned template material 116 and the template material 104. As a non-limiting example, depending on the material compositions and relative dimensions of the photoresist features 114a and the template material 104, the oxidizing agent (e.g., $O_2$) may comprise greater than or equal to about 10 percent of a total volume of the oxidizing plasma, such as greater than or equal to about 15 percent of the total volume of the oxidizing plasma, greater than or equal to about 20 percent of the total volume of the oxidizing plasma, greater than or equal to about 30 percent of the total volume of the oxidizing plasma, greater than or equal to about 40 percent of the total volume of the oxidizing plasma, or greater than or equal to about 50 percent of the total volume of the oxidizing plasma. The other components (e.g., He) may comprise the remainder of the oxidizing plasma. In some embodiments, $O_2$ is provided into a chamber configured to generate the oxidizing plasma at a flow rate of about 15 standard cubic centimeters per minute (sccm), and He is provided into the chamber at a flow of about 68 sccm. Conditions, such as temperature and pressure, for generating and maintaining the oxidizing plasma may be conventional and, therefore, are not described in detail herein.

Exposure to the oxidizing plasma may continue until the template features 116a of the patterned template material 116 each exhibit a desired width $W_2$. The width $W_2$ may be selected based on one or more desired properties of a self-assembled block copolymer material (not shown) to be formed using the patterned template material 116 (e.g., through a conventional chemical pattern directed self-assembly process). The width $W_2$ may, for example, be selected to be substantially the same as a width of at least one polymer domain of the self-assembled block copolymer material to be formed. The width of the polymer domain may be at least partially determined by the chain length of a block copolymer utilized to form the self-assembled block copolymer material. By way of non-limiting example, the width $W_2$ of each of the template features 116a may be less than or equal to about 30 nm, such as less than or equal to about 20 nm, less than or equal to about 15 nm, or less than or equal to about 10 nm. In some embodiments, the width $W_2$ of each of the template features 116a is about 15 nm. The template features 116a may each exhibit substantially the same thickness $T_1$ as the template material 104 (FIG. 1D), and a pitch $P_2$ between adjacent template features 116a of the patterned template material 116 may be substantially the same as the pitch $P_1$ between the adjacent photoresist features 114a of the patterned photoresist 114 (FIG. 1D).

Figure 1F:
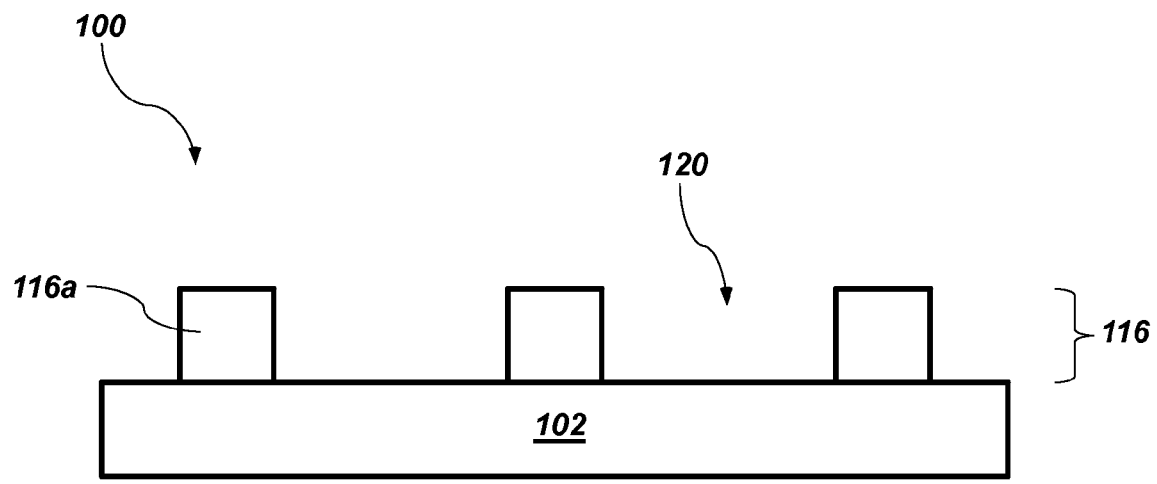

Referring to FIG. 1F, following the formation of the patterned template material 116, the semiconductor device structure 100 may be exposed to a positive tone developer to selectively remove the trimmed photoresist features 118a. The positive tone developer may be any developer formulated to substantially completely remove the trimmed photoresist features 118a without substantially removing the template features 116a of the patterned template material 116. By way of non-limiting example, the positive tone developer may be an aqueous alkaline solution, such as an aqueous solution of a quaternary ammonium salt (e.g., TMAH, tetraethylammonium hydroxide, tetrabutylammonium hydroxide), primary amines (e.g., ethylamine, n-propylamine), secondary amines (e.g., diethylamine, di-n-propylamine), tertiary amines (e.g., triethylamine), alcoholamines (e.g., triethanolamine), inorganic alkalis (e.g., potassium hydroxide, sodium hydroxide, ammonia water), and combinations thereof. The aqueous alkaline solution may include from about 1% by weight to about 5% by weight of the quaternary ammonium salt, primary amine, secondary amine, tertiary amine, alcoholamine, or inorganic alkali. Optionally, the positive tone developer may also include at least one additive, such as at least one of a surfactant, an antifoam agent, and a salt. In some embodiments, the positive tone developer is an aqueous 2.38% TMAH solution.

Advantageously, the positive tone developer used to remove the trimmed photoresist features 118a may be substantially free of many hazardous materials associated with conventional methods of removing positive tone photoresist features remaining after the formation of a patterned template material. As previously described, conventional methods of removing remaining positive tone photoresist features may require using at least one of a very limited number of suitable negative tone developers including hazardous solvents (e.g., DMSO). Such conventional methods may require complex, costly, and separate equipment to mitigate health, safety, and environmental concerns, and to prevent damage to other equipment utilized to form the patterned template material. In contrast, the method of the disclosure enables the trimmed photoresist features 118a to be removed using a relatively wide variety of less hazardous materials (e.g., materials not including organic solvents such as DMSO), which may not require the use of the complex, costly, and separate equipment needed for conventional methods.

Thus, in accordance with embodiments of the disclosure, a method of forming a semiconductor device structure comprises forming a template material over a substrate, the template material preferential wetting to a polymer block of a block copolymer. A positive tone photoresist material is formed over the template material. The positive tone photoresist material is exposed to radiation to form photoexposed regions and non-photoexposed regions of the positive tone photoresist material. The non-photoexposed regions of the positive tone photoresist material are removed with a negative tone developer to form a pattern of photoresist features. The pattern of photoresist features and unprotected portions of the template material are exposed to an oxidizing plasma to form trimmed photoresist features and a pattern of template features. The trimmed photoresist features are removed with a positive tone developer.

Furthermore, in accordance with additional embodiments of the disclosure, a method of forming a semiconductor device structure comprises forming a positive tone resist material over a template material over a substrate, the positive tone resist material formulated for negative tone development. The positive tone resist material is exposed to radiation having a wavelength of 193 nanometers to form a photoexposed photoresist material. The non-photoexposed regions of the photoexposed photoresist material are removed with a negative tone developer comprising an organic solvent to form a patterned photoresist material. The patterned photoresist material and the template material are exposed to a plasma consisting essentially of at least one oxidizing agent and at least one noble gas element to pattern the template material. Remaining portions of the patterned photoresist material are removed after patterning the template material.

In addition, a semiconductor device structure of an embodiment of the disclosure comprises a patterned template material over a substrate, the patterned template material formed by the method comprising forming a template material preferential wetting to a polymer block of a block copolymer over the substrate, forming a positive tone photoresist material formulated for negative tone development over the template material, exposing the positive tone photoresist material to radiation to form photoexposed regions of the positive tone photoresist material separated by non-photoexposed regions of the positive tone photoresist material, removing the non-photoexposed regions of the positive tone photoresist material to form a patterned photoresist material comprising photoresist features, exposing the photoresist features and unprotected portions of the template material to an oxidizing plasma to simultaneously form trimmed photoresist features and a patterned template material, and removing the trimmed photoresist features with an aqueous alkaline solution.

Following the removal of the trimmed photoresist features 118a, the semiconductor device structure 100 may be subjected to additional processing. For example, a neutral wetting material (not shown) may be formed within the trenches 120 between the template features 116a of the patterned template material 116, and a block copolymer material (not shown) may be formed on the template features 116a and the neutral wetting material. The block copolymer material may be self-assembled (e.g., by annealing) to form a self-assembled block copolymer material (not shown) including domains of at least one polymer block substantially aligned with the template features 116a of the patterned template material 116. Other domains of the self-assembled block copolymer material (e.g., domains of at least one other polymer block) may be selectively removed to form a polymeric pattern (not shown) including polymer features separated by additional trenches, the polymer features corresponding to the domains of the at least one polymer block. A pitch between adjacent polymer features of the polymeric pattern may be less than the pitch $P_2$ between adjacent template features 116a of the patterned template material 116. Such additional processing may be performed using conventional processes and equipment, which are not described in detail herein.

The methods of the disclosure may advantageously mitigate health, safety, and environmental concerns, reduce costs, and increase production efficiency as compared to conventional methods of foiming a semiconductor device structure including a patterned template material for use in chemical pattern directed self-assembly of a block copolymer material, such as conventional methods utilizing a positive tone developer to foini a patterned photoresist material, and a negative tone developer to remove portions of the patterned photoresist material remaining after the formation the pattered template material. In addition, patterned template materials formed by the methods of the disclosure may exhibit feature dimensions (e.g., thicknesses, widths) at least equivalent to those of patterned template materials formed by conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the disclosure as defined by the following appended claims and their legal equivalents.

What is claimed is:

1. A method of forming a semiconductor device structure, comprising:
   forming a positive tone photoresist material over a template material on a substrate, the template material exhibiting preferential wetting to polymer block a block copolymer;
   exposing the positive tone photoresist material to radiation to form photoexposed regions and non-photoexposed regions of the positive tone photoresist material;
   removing the non-photoexposed regions of the positive tone photoresist material with a negative tone developer to form a pattern of photoexposed photoresist features;
   exposing the pattern of photoexposed photoresist features and unprotected portions of the template material to an oxidizing plasma consisting essentially of helium and at least one oxidizing agent to form trimmed, photoexposed photoresist features and a pattern of template features; and
   removing the trimmed, photoexposed photoresist features with a positive tone developer.

2. The method of claim 1, wherein the template material comprises a material preferential wetting to a polystyrene block of a block copolymer.

3. The method of claim 1, wherein forming a positive tone photoresist material over a template material comprises forming the positive tone photoresist material over a template material having a thickness within a range of from about 5 nanometers to about 15 nanometers.

4. The method of claim 1, wherein forming a positive tone photoresist material comprises forming the positive tone photoresist material to a thickness within a range of from about 50 nanometers to about 100 nanometers.

5. The method of claim 1, wherein exposing the positive tone photoresist material to radiation to form photoexposed regions and non-photoexposed regions comprises forming the photoexposed regions to be substantially soluble in a positive tone developer and substantially insoluble in a negative tone developer.

6. The method of claim 1, wherein exposing the positive tone photoresist material to radiation to form photoexposed regions and non-photoexposed regions comprises forming each of the photoexposed regions to exhibit substantially the same dimensions.

7. The method of claim 1, wherein exposing the positive tone photoresist material to radiation to form photoexposed regions and non-photoexposed regions comprises forming each of the photoexposed regions to a width within a range of from about 30 nanometers to about 70 nanometers.

8. The method of claim 1, wherein removing the non-photoexposed regions of the positive tone photoresist material with a negative tone developer comprises removing the non-photoexposed regions with at least one of a ketone-based solvent, an ester-based solvent, an alcohol-based solvent, an amide-based solvent, an ether-based solvent, and a hydrocarbon-based solvent.

9. The method of claim 1, wherein removing the non-photoexposed regions of the positive tone photoresist material with a negative tone developer to form a pattern of photoexposed photoresist features comprises forming each of the photoresist features to exhibit substantially the same dimensions and spacing as the photoexposed regions of the positive tone photoresist material.

10. The method of claim 1, wherein exposing the pattern of photoresist features and unprotected portions of the template material to an oxidizing plasma comprises exposing the pattern of photoexposed photoresist features and the unprotected portions of the template material to a plasma that increases a solubility of the trimmed, photoexposed photoresist features in a positive tone developer relative to a solubility of the photoexposed photoresist features in the positive tone developer.

11. The method of claim 1 wherein expncing the pattern of photoexposed photoresist features and unprotected portions of the template material to an oxidizing plasma to form trimmed, photoexposed photoresist features and a pattern of template features comprises forming each of the template features to a width less than or equal to about 15 nanometers.

12. The method of claim 1, wherein removing the trimmed, photoexposed photoresist features with a positive tone developer comprises removing the trimmed, photoexposed photoresist features with an aqueous alkaline solution.

13. The method of claim 1, wherein removing the trimmed, photoexposed photoresist features with a positive tone developer comprises removing the trimmed, photoexposed photoresist features with an aqueous alkaline solution comprising from about 1% by weight to about 5% by weight of one or more of a quaternary ammonium salt, a primary amine, a secondary amine, a tertiary amine, an alcoholamine, and an inorganic alkali.

14. The method of claim 1, further comprising:
 forming a neutral wetting material within trenches between template features of the pattern of template features;
 forming the block copolymer on the template features and the neutral wetting material; and
 annealing the block copolymer to form a self-assembled block copolymer comprising domains of the polymer block substantially aligned with the template features.

15. A method of forming a semiconductor device structure, comprising:
 forming a positive tone resist material over a template material over a substrate, the positive tone resist material formulated for negative tone development;
 exposing the positive tone resist material to radiation having a wavelength of 193 nanometers to form a photoexposed photoresist material;
 removing non-photoexposed regions of the photoexposed photoresist material with a negative tone developer comprising an organic solvent to form a patterned photoresist material;
 exposing the patterned photoresist material and the template material to an oxidizing plasma selected from the group consisting of a plasma of oxygen and helium, a plasma of sulfur dioxide and helium, and a plasma of oxygen, sulfur dioxide, and helium to pattern the template material; and
 removing remaining portions of the patterned photoresist material after patterning the template material.

16. The method of claim 15, wherein removing non-photoexposed regions of the photoexposed photoresist material comprises selectively removing the non-photoexposed regions of the photoexposed photoresist material with n-butyl acetate.

17. The method of claim 15, wherein exposing the patterned photoresist material and the template material to an oxidizing plasma comprises selecting the oxidizing, plasma to consist essentially of oxygen and helium.

18. The method of claim 15, wherein removing remaining portions of the patterned photoresist material comprises removing the remaining portions of the patterned photoresist material with an aqueous 2.38 percent tetramethylammonium hydroxide solution.

19. The method of claim 15, wherein removing remaining portions of the patterned photoresist material comprises exposing the remaining portions of the patterned photoresist material to a positive tone developer.

* * * * *

UNITED STATES PATENT AND TRADEMARK OFFICE
CERTIFICATE OF CORRECTION

Page 1 of 1

PATENT NO. : 9,229,328 B2
APPLICATION NO. : 13/875918
DATED : January 5, 2016
INVENTOR(S) : Ranjan Khurana, Gurpreet S. Lugani and Dan B. Millward It is certified that error appears in the above-identified patent and that said Letters Patent is hereby corrected as shown below:

In the specification:

| | | |
|---|---|---|
| COLUMN 1, | LINE 60, | change "includes foiniing a" to --includes forming a-- |
| COLUMN 3, | LINE 17, | change "relational teiris," to --relational terms,-- |
| COLUMN 7, | LINE 53, | change "to forni a" to --to form a-- |
| COLUMN 7, | LINE 56, | change "to faun" to --to form-- |
| COLUMN 11, | LINE 39, | change "of foiming a" to --of forming a-- |
| COLUMN 11, | LINE 43, | change "to foini a" to --to form a-- |

In the claims:

| | | | |
|---|---|---|---|
| CLAIM 1, | COLUMN 11, | LINE 66, | change "to polymer block a" to --to a polymer block of a-- |
| CLAIM 11, | COLUMN 12, | LINE 66, | change "wherein expncing the" to --wherein exposing the-- |
| CLAIM 17, | COLUMN 14, | LINE 20, | change "the oxidizing, plasma" to --the oxidizing plasma-- |

Signed and Sealed this
Nineteenth Day of April, 2016

Michelle K. Lee
*Director of the United States Patent and Trademark Office*